(12) United States Patent
Chiu et al.

(10) Patent No.: US 6,696,644 B1
(45) Date of Patent: Feb. 24, 2004

(54) POLYMER-EMBEDDED SOLDER BUMPS FOR RELIABLE PLASTIC PACKAGE ATTACHMENT

(75) Inventors: Tz-Cheng Chiu, Plano, TX (US); Manjula N. Variyam, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/215,115

(22) Filed: Aug. 8, 2002

(51) Int. Cl.[7] ............................................. H01L 23/28
(52) U.S. Cl. ...................... 174/52.2; 257/738; 257/734
(58) Field of Search .................. 174/52.2; 361/724, 361/743, 780; 257/737, 738, 734, 778, 787

(56) References Cited

U.S. PATENT DOCUMENTS

| | | | | |
|---|---|---|---|---|
| 5,709,146 A | * | 1/1998 | Watanabe | 101/128.21 |
| 5,879,792 A | * | 3/1999 | Watanabe et al. | 428/304.4 |
| 6,385,049 B1 | * | 5/2002 | Chia-Yu et al. | 361/721 |
| 2002/0015292 A1 | * | 2/2002 | Pritchett et al. | 361/780 |
| 2002/0084521 A1 | * | 7/2002 | Coyle et al. | 257/690 |
| 2002/0164838 A1 | * | 11/2002 | Moon et al. | 438/107 |

* cited by examiner

*Primary Examiner*—Dean A. Reichard
*Assistant Examiner*—Adolfo Nino
(74) *Attorney, Agent, or Firm*—Michael K. Shrehot; Wade James Brady, III; Frederick J. Telecky, Jr.

(57) ABSTRACT

A plastic package for use in semiconductor devices, which has a plurality of metallic terminals exposed on a package surface and a metallic bump attached to each of said terminals. The bumps are made of reflowable metal and have approximately uniform height. An adherent layer of polymer material covers the package surface and surrounds each of the bumps to form a solid meniscus. The layer has a thickness between a quarter and one half of the bump height. An analogous methodology applies to plastic assembly boards.

11 Claims, 3 Drawing Sheets

POLYMER-EMBEDDED SOLDER BUMPS FOR RELIABLE PLASTIC PACKAGE ATTACHMENT

FIELD OF THE INVENTION

The present invention is related in general to the field of electronic systems and semiconductor devices and more specifically to the field of plastic packages attached to boards by solder balls, wherein an auxiliary plastic layer between the solder balls enhances the temperature cycling reliability of the plastic package.

DESCRIPTION OF THE RELATED ART

The structure of contact pad metallizations and solder bumps for connecting integrated circuit (IC) chips to semiconductor packages or outside parts, as well as the thermomechanical stresses and reliability risks involved, have been described in a series of detailed publications by the International Business Machines Corporation in 1969 (IBM J. Res. Develop., Vol. 13, pp. 226–296).

During and after assembly of the IC chip to an outside part such as a substrate or circuit board by solder reflow, and then during device operation, significant temperature differences and temperature cycles appear between semiconductor chip and the substrate. The reliability of the solder joint is strongly influenced by the coefficients of thermal expansion of the semiconductor material and the substrate material. For example, there is more than one order of magnitude difference between the coefficients of thermal expansion of silicon and FR-4. This difference causes thermomechanical stresses, which the solder joints have to absorb. Detailed calculations, in the literature cited above and in other publications of the early 1980's, involving the optimum height and volume of the solder connection and the expected onset of fatigue and cracking proposed a number of solder design solutions.

The fabrication methods and reliability problems involving flip-chips re-appear in somewhat modified form for ball-grid array type packages. In their book "Chip Scale Package" (McGraw-Hill, 1999), John H. Lau and Shi-Wei Ricky Lee describe various semiconductor devices and packages of contemporary "chip-scale" families, as they are fabricated by a number of semiconductor companies worldwide. The newest designs and concepts in microelectronics assembly and packaging are aiming for a package with a planar area not substantially greater than the silicon chip itself, or at most 20% larger area. This concept, known as Chip-Scale Package (CSP), is finding particular favor with those electronics industries where the product size is continually shrinking such as cellular communications, pagers, hard disk drivers, laptop computers and medical instrumentation. Most CSP approaches are based on assembly with solder bumps or solder balls on the exterior of the package, to interface with system or wiring boards.

The ball grid array or CSP may be attached directly to a printed circuit board (PCB), or alternatively, coupled to a second interconnection surface such as an interposer. In the latter case, attaching the ball grid array to the next interconnect is carried out by aligning the solder bumps or balls on the package to contact pads on the second level interconnection and then performing a second solder reflow operation. During the reflow, the bumps or balls liquefy and make a bond to the next interconnect level which has pads or traces to receive the solder. Following the solder reflow step, a polymeric underfill is often used between the package and the interposer (or PCB) to alleviate mechanical stress caused by the mismatch in the coefficients of thermal expansion (CTE) between the package, the interposer, if any, and the PCB. Many reliability problems occur due to the stress placed on the solder bumps or balls when the assembly is cycled from hot to cool during operation.

One method of drastically reducing the thermomechanical stress on the solder bumps has been utilized in Tessera's Micro-Ball Grid Array packages. A sheet-like compliant elastomer substantially de-couples the solder bumps, affixed to the outside PCB, from the IC chip and the interposer, thus relieving the thermal mismatch. Among the drawbacks of this method are assembly hurdles and cost considerations.

Another method aims at absorbing part of the thermomechanical stress on the solder joints by plastic material surrounding the joints and filling the gap between chip and substrate. See for instance, U.S. Pat. No. 6,228,680, issued on May 8, 2001; U.S. Pat. No. 6,213,347, issued on Apr. 10, 2001, and U.S. Pat. No. 6,245,583, issued on Jun. 12, 2001 (Thomas et al., Low Stress Method and Apparatus for Underfilling Flip-Chip Electronic Devices). However, the underfilling method represents an unwelcome process step after device attachment to the motherboard.

In a recent wafer-level process approach by Kulicke & Soffa, flux-impregnated epoxy is screened on the wafer, with openings for the chip contact pads. The solder balls are placed on the pads; during the reflow process, the epoxy softens and forms a fillet at the base of the solder ball. An epoxy "collar" extends about 50 to 100 $\mu$m up the side of the solder ball from the chip surface, where stress-induced cracks typically originate. This collar restricts the creep flow of the solder, where cracks typically form. The wafer-level process with the required high temperature of solder reflow cannot be transferred to individual plastic packages. As another drawback, the adhesion between the solder balls and the plastic fillet is weak at best and often non-existent.

An urgent need has arisen for a coherent, low-cost method of preventing stress-induced solder bump cracks during temperature cycling for ball-grid array packages. The method should be flexible enough to be applied for different semiconductor product families and a wide spectrum of plastic package design and process variations. Preferably, these innovations should be accomplished using the installed equipment base so that no investment in new manufacturing machines is needed.

SUMMARY OF THE INVENTION

A plastic package for use in semiconductor devices is described, which has a plurality of metallic terminals exposed on a package surface and a metallic bump attached to each of said terminals. The bumps are made of reflowable metal and have approximately uniform height. An adherent layer of polymer material covers the package surface and surrounds each of the bumps to form a solid meniscus. The layer has a thickness between a quarter and one half of the bump height. An analogous methodology applies to plastic assembly boards.

In the method for completing a polymer plastic package according to the invention, the solder bumps are attached and reflowed first, resulting in an approximately uniform predetermined height. Then, a water-soluble polymer is stencil-printed to coat the top surface of the bumps. In a vacuum chamber, an energy-controlled plasma roughens and cleans the polymer surface, improving the surface affinity to adhesion. An adherent polymeric precursor is distributed between and around the bumps to form a meniscus on each of the bumps and fill the space between the bumps with a layer having a thickness between a quarter and one half of the height of the bumps. Additional thermal energy cures the polymeric precursor, solidifying the layer and the meniscus. Finally, DI water removes the water-soluble polymeric bump coating.

Detailed model calculations as well as experimental data show that the polymer coat on plastic packages, applied by the method of the invention, reduces the plastic energy density by 50% and increases the board-level reliability in temperature cycling from −40 to +125° C. by 50% compared to standard plastic packages.

It is an aspect of the present invention to provide a flexible methodology of fabrication and material selection to achieve the benefit of the stress-relieving polymer coat.

Another aspect of the invention is to provide a methodology for a wide range of plastic ball-grid array and chip-scale packages.

It is a technical advantage of the present invention that a wide variety of solder alloys and reflow temperatures can be employed for the stress-reduced packages.

Another technical advantage is the possibility to apply the new methodology to plastic assembly boards with solder bumps for a wide variety of applications.

Other technical advantages of the present invention include an improved reliability of the assembled device without the need of a polymer interface layer at the contact pads, or a polymer underfill for the bump-assembled device, reducing the manufacturing cost.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 09/952,454, filed on Sep. 14, 2001 (Owens et al., "Improved Adhesion by Plasma Conditioning of Semiconductor Chip Surfaces"), which is incorporated herewith by reference.

The present invention is further related to U.S. Pat. No 6,213,347, issued Apr. 10, 2001, and U.S. Pat. No. 6,228, 680, issued May 8, 2001 (both Thomas, "Low Stress Method and Apparatus for Underfilling Flip-Chip Electronic Devices"); and U.S. Pat. No. 6,245,583, issued Jun. 12, 2001 (Amador et al., "Low Stress Method and Apparatus of Underfilling Flip-Chip Electronic Devices").

Figure 1:
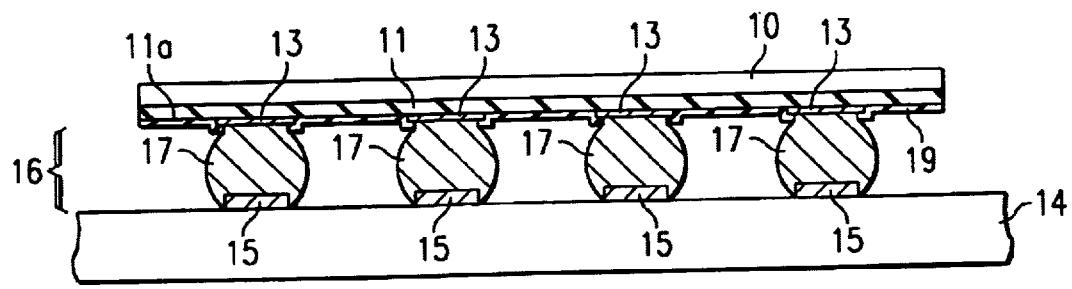
FIG. 1 is a schematic and simplified cross section of a package assembled on an external part using reflowable metal bumps.

The present invention provides the process to minimize the thermomechanical stress in a microelectronic assembly of a plastic package and a printed circuit board as shown schematically and simplified in FIG. 1. A portion of the assembly in FIG. 1 is enlarged in FIG. 2 to show some detail of the thin layer structure. An integrated circuit package, preferably formed of plastic material such as molding compound surrounding silicon 10 on a flexible substrate 11, comprises a package surface 11a where a plurality of terminal pads 13 are located. These terminal pads 13 are preferably made of the package metallization such as copper or gold flash over copper.

Package 10 and 11 is mounted to a substrate or board 14, integral with interconnections and a plurality of terminal pads 15, yet spaced apart by a gap 16. Substrate 14 preferably comprises a printed circuit board made of FR-4 or a glass-epoxy laminate; contact pads 15 are preferably composed of solder-wettable copper. Package 10 and 11 is attached by reflowable bump interconnections 17 which extend across the gap and connect the terminal pads 13 on the package to the terminal pads 15 on the substrate both electrically and mechanically. Preferably, tin or a tin alloy (such as tin/indium, tin/bismuth, tin/lead) of a desirable melting temperature is chosen for bumps 17 to accomplish the reflow at a practical temperature. Bumps 17 are often referred to as "solder" bumps. For silicon packages, the protective "soldermask" 19 in FIGS. 1 and 2 can be made of a variety of insulating materials including polymers such as polyimide.

In known technology, the gap 16 is often filled with a polymeric encapsulant that extends over the printed circuit board about the perimeter of the package. The main purpose of encapsulant, commonly referred to as the "underfill" material, is a reduction of mechanical stress in the assembly; another purpose is the protection of the active chip surface. The thermomechanical stress originates from the difference of the coefficient of thermal expansion between silicon and the board material in the process of board assembly (solder bump reflow) and temperature cycle testing (usually from −40 to +125° C.).

Figure 2:
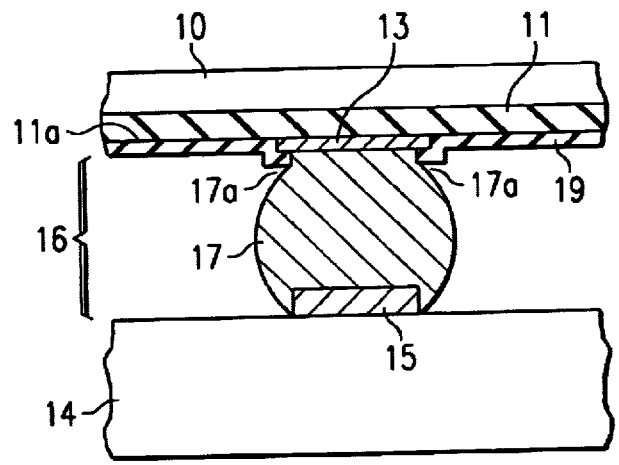
FIG. 2 is an enlargement of a portion of FIG. 1.

Silicon, the preferred semiconductor material of chip 10, has a CTE between 2 and 3 ppm/° C., typical substrates 14 however a CTE between about 15 and 22 ppm/° C.; CTEs of the metals in the assembly vary from 4.3 to 17.0. The materials are mechanically coupled intimately, even rigidly, to each other in the assembly of a ball-grid array package. For the standard assembly process flow, the temperature reaches the maximum of 220° C. because of an overshoot over the melting temperature of 183° C. of the eutectic tin-lead alloy (63 weight % tin). After the solder has molten and is beginning to cool, the stress is zero and stays zero to the eutectic temperature of 183° C. With continued cooling of the assembly, though, stress starts appearing and increases rapidly. When ambient temperature is reached, the stress levels reach levels so high that damage by nascent cracking has often been inflicted to the structurally weakest parts of the assembly, especially the solder joints, the chip multilevel dielectric films, or the protective soldermask 19 in FIGS. 1 and 2. The package 10 and 11 in FIGS. 1 and 2 is now arranged on substrate 14 such that each of the substrate terminal pads 15 registers with a package terminal pad 13, with the solder bumps therebetween. By way of example, the gap 16 between active surface 11 of the chip and the substrate is preferably between 300 and 700 μm.

Figure 3:
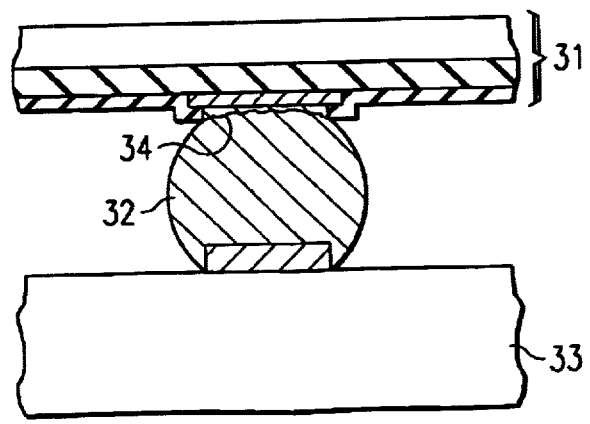
FIG. 3 is an enlargement of a portion of FIG. 1 showing the development of a crack through the reflowable metal bump.

Computer stress modeling can be applied according to Darveaux's fatigue model to solder bump interconnections as shown in FIGS. 1 and 2 (see R. Darveaux, K. Banerji, A. Mawer, and G. Dody, "Reliability of plastic ball grid array assembly", Ball Grid Array Technology, J. Lau Editor, McGraw-Hill, Inc. New York, 1995; R. Darveaux, "Effect of simulation methodology on solder joint crack growth correlation", Proc. IEEE, 50$^{th}$ Elec. Comp. Tech. Conf., pp.1048–1058, 2000). The computer results reveal that the regions of highest stress in temperature cycling is the zone designated 17a in FIG. 2. In a typical assembly design with a solder joint width of 0.45 mm, the average plastic energy density in zone 17a is about 115 kJ/m$^3$, and the maximum energy density is a high as 703 kJ/m$^3$. These high values cause the damage to initiate already at 588 cycles (between −40 and +125° C.), the rate of crack propagation per cycle to reach 0.159 μm/cycle, and thus the number of cycles to complete crack propagation to be 2836 cycles. The board level reliability is thus limited to 3424 cycles. The schematic FIG. 3 illustrates a complete crack 30 through the solder joint region of a package 31 assembled by bumps 32 to board 33.

Figure 4:
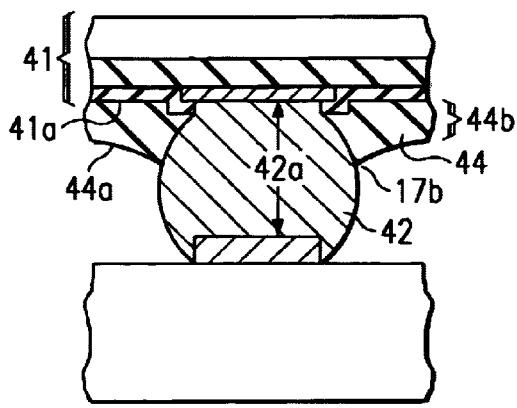
FIG. 4 is a schematic cross section of a portion of a plastic package having a reflowable metal bump attached to an external part, and an adherent polymer layer surrounding the package-near portion of the solder joint.

The stress relief provided by the present invention focuses exactly on the region 34 of highest stress. The cross section of schematic FIG. 4 depicts an adherent layer 44 of polymer material covering the surface 41a of the package 41 and surrounding bump 42 to form a solid meniscus 44a. The thickness 44a of the layer 44 is between about one quarter and one half of the height 42b of bump 42.

In FIG. 4, the plastic package 41 may be made of any polymeric material used in semiconductor encapsulation, including molding compounds, thermoset or thermoplastic formulations, and plastic films. The package 41 may belong to the ball grid array or chip-scale families, or any package design using reflow interconnectors 42 for the assembly to external parts.

The reflowable metal of bumps 42 is selected from a group consisting of tin, indium, tin alloys including tin/indium, tin/silver, tin/bismuth, and tin/lead, conductive adhesives, and z-axis conductive materials. The bumps 42 have a diameter from about 50 to 700 μm, a center-to-center spacing between about 100 and 1300 μm, and approximately uniform height.

The polymer for the adherent layer 44 includes non-electrically conductive adhesives, epoxies filled or unfilled with inorganic particulate fillers including boron nitride or aluminum nitride, bisphenol A with an anhydride cross-linking agent, having a viscosity of <8000 cps and an elasticity modulus between about 1 and 5 GPa. Suitable adhesive polymer precursors are commercially available, for instance, from the company Loctite, Rocky Hill, Conn. 06067, USA, under the trade name Hysol® QMI 536HT; Hysol® FP4450HA; or Product 3563.

By way of example, the assembly design having a solder joint width of 0.45 mm, discussed earlier for Darveaux's fatigue model, shows significant improvements after implementing the adhesive polymer layer. For the zone 17b of highest stress (see FIG. 4), the computer results indicate now an average plastic energy density of only about 97 kJ/m$^3$, and a maximum plastic energy density of only about 513 kJ/m$^3$. These lower values postpone the initiation of a nascent crack in temperature cycling (between −40 to +125° C.) to 768 cycles. The rate of crack propagation per cycle is now 0.134 μm/cycle, for 4285 cycles to complete the crack propagation (the crack length is also extended to 0.573 mm due to the wider bump diameter at the location of highest stress). The board level reliability is thus extended to 5053 cycles, an almost 50% improvement compared to the board level reliability before the application of the polymer layer.

Figure 5:
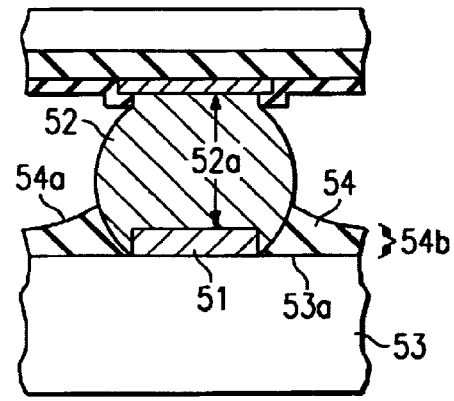
FIG. 5 is a schematic cross section of a portion of a substrate having a solder interconnection to a semiconductor package, and an adherent polymer layer surrounding the substrate-near portion of the solder joint.

As illustrated in FIG. 5, it is an important aspect of the present invention that a stress-reducing polymer layer similar to layer 44 depicted in FIG. 4 can be used for reliability improvements of bumps attached to polymeric substrates such as assembly boards. These substrates 53 have a plurality of metallic terminals 51 exposed on a substrate surface 53a. A metallic bump 52 is then attached to each of these terminals 51, wherein these bumps are made of reflowable metal and have approximately uniform height. An adherent layer 54 of polymer material covers the substrate surface 53a and surrounds each of the bumps 52 to form a solid meniscus 54a. This layer has a thickness 54b between about one quarter and one half of the bump height 52a.

The substrates or assembly boards are selected from a group consisting of organic materials including FR-4, FR-5, and BT resin, with or without strengthening or thermally modulating fibers or fillers, including a grid of glass fibers.

Figure 6:
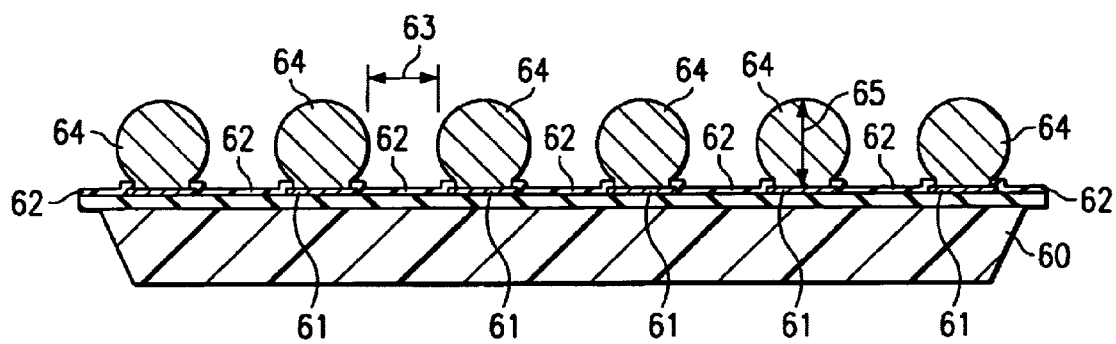
FIGS. 6 to 10 are schematic cross sections of a plastic package and a plurality of solder bumps, illustrating the process flow for completing a plastic semiconductor package with polymer-embedded solder bumps.
Figure 7:
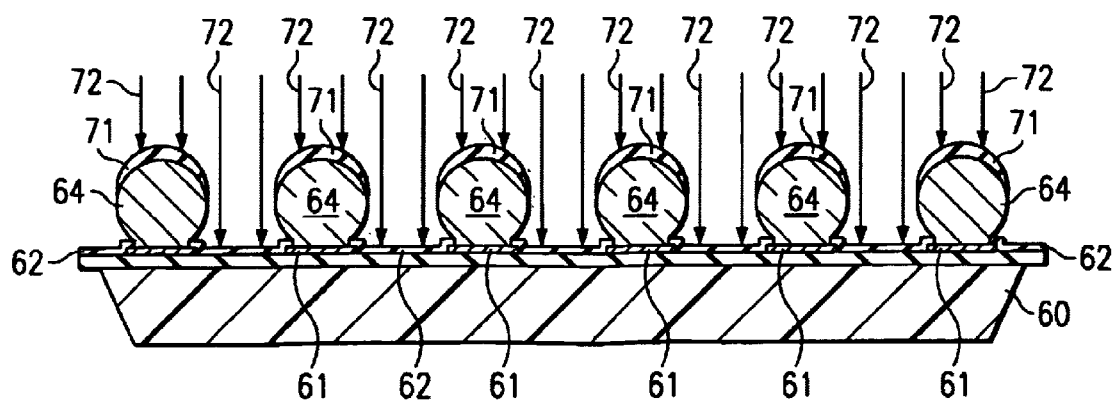
Figure 8:
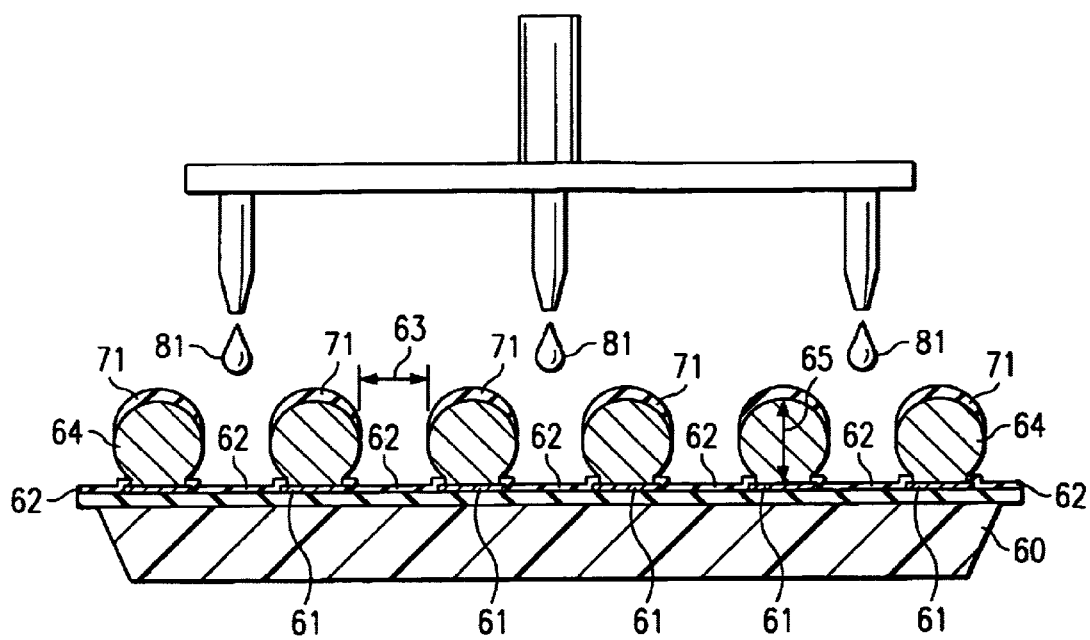
Figure 9:
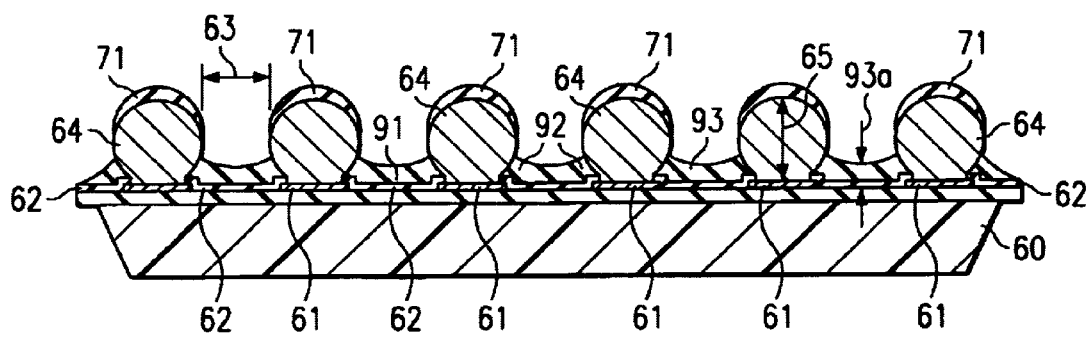
Figure 10:
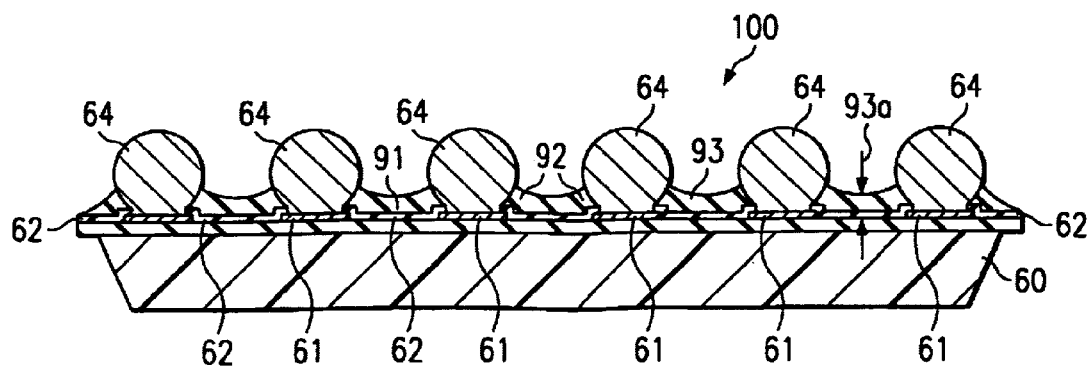

The method for completing a plastic package for semiconductor devices by fabricating polymer-embedded solder bumps progresses in the steps illustrated in FIGS. 6 to 10. The process flow is as follows:

| | | |
|---|---|---|
| FIG. 6: | Step 1: | Providing a plastic package 60 having a plurality of metallic terminals 61 exposed on the package surface 62; the terminals are spaced apart by some distance 63. |
| | Step 2: | Attaching a metallic bump to each of the terminals; the bumps are made of reflowable metal and have approximately uniform mass and height 65. |
| | Step 3: | Reflowing the bumps, while maintaining approximate uniformity of predetermined height 65. |
| FIG. 7: | Step 4: | Applying a water-soluble polymer 71 to coat the top surface of the bumps 64. |
| | Step 5: | Positioning the package 60 in the vacuum chamber of a plasma apparatus so that the surface 62 faces the plasma source. |
| | Step 6: | initiating a plasma and controlling the ion mean free path so that the ions 72 reach the surface 62 with predetermined energy. |
| | Step 7: | Exposing the surface 62 to the plasma 72 for a length of time sufficient to roughen the polymer surface 62; clean the polymer surface 62 from organic contamination; and improve the surface affinity to adhesion. |
| | Step 8: | Removing the package 60 from the vacuum chamber. |
| FIG. 8: and FIG. 9: | Step 9: | Distributing an adherent polymeric precursor 81 between (91) and around the bumps 64, to form a meniscus 92 on each of the bumps 64 and to fill the space 63 between the bumps 64 by a layer 93 having a thickness 93a between one quarter and one half of the height 65 of the bumps 64. |
| FIG. 9: | Step 10: | Supplying additional thermal energy for curing the polymeric precursor, whereby the layer 93 and said meniscus 92 solidify. |
| | Step 11: | Cooling the package to ambient temperature. |
| FIG. 10: | Step 12: | Polishing off excessive polymer on top of solder balls 64. |
| | Step 13: | Washing the assembled package, generally designated 100, in DI water to remove the water-soluble polymeric bump coating, completing the plastic package. |

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A plastic package for use in semiconductor devices, said package having a plurality of metallic terminals exposed on a package surface, comprising:
   a metallic bump attached to each of said terminals, said bumps made of reflowable metal and having approximately uniform height; and
   an adherent layer of polymer material covering said package surface and surrounding each of said bumps to form a solid meniscus, said layer having a thickness between a quarter and one half of said bump height at the peak of said meniscus.

2. The package according to claim 1 wherein said plastic is any polymeric material used in semiconductor encapsulation, including molding compounds as well as thermoset and thermoplastic formulations.

3. The package according to claim 1 wherein said semiconductor devices include any product of the ball-grid array and chip-scale package families.

4. The package according to claim 1 wherein said reflowable metal is selected from a group consisting of tin, indium, tin alloys including tin/indium, tin/silver, tin/bismuth, and tin/lead, conductive adhesives, and z-axis conductive materials.

5. The package according to claim 1 wherein said bumps have a diameter from about 50 to 700 $\mu$m and a center-to-center spacing between about 100 and 1300 $\mu$m.

6. The package according to claim 1 wherein said polymer material for said adherent layer includes non-electrically conductive adhesives, epoxies filled with inorganic particulate fillers including boron nitride or aluminum nitride, bisphenol A with an anhydride cross-linking agent, having a viscosity of <8000 cps and an elasticity modulus between about 1 and 5 GPa.

7. A polymeric substrate for use in electronic assembly boards, said substrate having a plurality of metallic terminals exposed on a substrate surface, comprising:
   a metallic bump attached to each of said terminals, said bumps made of reflowable metal and having approximately uniform height; and
   an adherent layer of polymer material covering said substrate surface and surrounding each of said bumps to form a solid meniscus, said layer having a thickness between a quarter and one half of said bump height at the peak of said meniscus.

8. The substrate according to claim 7 wherein said assembly board is selected from a group consisting of organic materials, including FR-4, FR-5, and BT resin.

9. A method for completing a polymer plastic package for use in semiconductor devices, comprising the steps of:
   providing a polymer package having a plurality of metallic terminals exposed on a package surface, said terminals spaced apart;
   attaching a metallic bump to each of said terminals, said bumps made of reflowable metal and having approximately uniform mass and height;
   reflowing said bumps, while maintaining approximate uniformity of predetermined height;
   stencil-printing a water-soluble polymer to coat the top surface of said bumps;
   positioning said packages in the vacuum chamber of a plasma apparatus so that said surface faces the plasma source;
   initiating a plasma and controlling the ion mean free path so that said ions reach said surface with predetermined energy;
   exposing said surface to said plasma for a length of time sufficient to roughen said polymer surface;
     clean said polymer surface from organic contamination; and
     improve the surface affinity to adhesion;
   removing said package from said vacuum chamber;
   distributing an adherent polymeric precursor between and around said bumps, to form a meniscus on each of said bumps and to fill said space between said bumps by a layer having a thickness between a quarter and one half of said height of said bumps;
   supplying additional thermal energy for curing said polymeric precursor, whereby said layer and said meniscus solidify;
   cooling the package to ambient temperature; and
   washing said package in DI water to remove said water-soluble polymeric bump coating, completing said plastic package.

10. The method according to claim 9 wherein said water-soluble polymer is polyvinyl alcohol.

11. The method according to claim 9 further comprising the process step of slightly polishing said bump surfaces before said step of washing to remove excess polymer.

* * * * *